United States Patent
Hsu

(10) Patent No.: US 7,358,567 B2
(45) Date of Patent: Apr. 15, 2008

(54) HIGH-VOLTAGE MOS DEVICE AND FABRICATION THEREOF

(75) Inventor: Jen-Yao Hsu, Hsinchu Hsine (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/709,924

(22) Filed: Jun. 7, 2004

(65) Prior Publication Data

US 2005/0269632 A1  Dec. 8, 2005

(51) Int. Cl.
*H01L 21/8234* (2006.01)

(52) U.S. Cl. .............. 257/335; 257/336; 257/341; 257/E21.444; 257/E29.04

(58) Field of Classification Search ............ 257/335, 257/336, 370, 486, 482, 328, 329, 481
See application file for complete search history.

(56) References Cited

U.S. PATENT DOCUMENTS

| | | | | |
|---|---|---|---|---|
| 6,214,674 B1 | 4/2001 | Tung | ............ | 438/275 |
| 6,265,752 B1 * | 7/2001 | Liu et al. | ............ | 257/487 |
| 6,306,700 B1 * | 10/2001 | Yang | ............ | 438/217 |
| 6,333,234 B1 * | 12/2001 | Liu | ............ | 438/307 |
| 6,448,137 B1 * | 9/2002 | Lai et al. | ............ | 438/258 |
| 2005/0118768 A1 * | 6/2005 | Chen | ............ | 438/301 |

* cited by examiner

*Primary Examiner*—Thomas Dickey
*Assistant Examiner*—Fazli Erdem
(74) *Attorney, Agent, or Firm*—Jianq Chyun IP Office

(57) ABSTRACT

A HV-MOS device is described, including a substrate, a gate dielectric layer and a gate, a channel region, two doped regions as a source and a drain, a field isolation layer between the gate and at least one of the two doped regions, a drift region and a modifying doped region. The drift region is located in the substrate under the field isolation layer and connects with the channel region and the at least one doped region. The modifying doped region is at the periphery of the at least one doped region.

9 Claims, 2 Drawing Sheets

HIGH-VOLTAGE MOS DEVICE AND FABRICATION THEREOF

BACKGROUND OF INVENTION

1. Field of the Invention

The present invention relates to a semiconductor device and a method for fabricating the same. More particularly, the present invention relates to a high-voltage metal-oxide-semiconductor (HV-MOS) device and a method for fabricating the same.

2. Description of the Related Art

HV-MOS devices are widely used in power circuits, having particular structures for sustaining high voltages and increasing breakdown voltages. FIG. 1 illustrates the top view of a conventional HV-MOS device, which includes a field oxide (FOX) layer 110, a gate 120, a channel region 130 under the gate 120 surrounded by the FOX layer 110, a source region 140 and a drain region 150 beside the channel region 130 each surrounded by the FOX layer 110, and a drift region 160 between the channel region 130 and each of the source region 140 and the drain region 150. The drift region 160 is formed by implanting a dopant into the substrate using a mask layer having an opening 180 therein as one part of the implantation mask. Before the implantation, the regions predetermined for the channel region 130, the source region 140 and the drain region 150 are covered with another mask layer that defines the active areas and serves as the other part of the implantation mask.

In the above-mentioned HV-MOS device, the FOX layer 110 between the channel region 130 and the source/drain region 140/150 serves as a field isolation layer that allows the device to sustain a high voltage. In addition, the source/drain region 140/150 usually consists of a heavily doped contact region and a lightly doped grade region under the contact region for increasing the breakdown voltage of the device. However, breakdown still occurs easily at the corners of the grade regions.

SUMMARY OF INVENTION

In view of the foregoing, this invention provides a high-voltage metal-oxide-semiconductor (HV-MOS) device that has a higher breakdown voltage.

This invention also provides a method for fabricating a HV-MOS device capable of increasing the breakdown voltage of the HV-MOS device.

The HV-MOS device of this invention includes a substrate, a gate dielectric layer, a gate, a channel region, two doped regions as a source and a drain, a field isolation layer, a drift region and a modifying doped region. The gate dielectric layer is disposed on the substrate, the gate on the gate dielectric layer, and the channel region in the substrate under the gate dielectric layer. The two doped regions as the source and the drain are located in the substrate beside the gate, and the field isolation layer between the gate and at least one of the two doped regions. The drift region is located in the substrate under the field isolation layer and connects with the channel region and the at least one doped region, and the modifying doped region in the substrate at the periphery of the at least one doped region.

In the method for fabricating a HV-MOS device of this invention, the regions of the substrate where the channel region, the source and the drain region will be formed are firstly covered with a mask layer. A portion of the substrate between the channel region and the region predetermined for the at least one doped region and another portion of the substrate at the periphery of the predetermined region are implanted with a dopant to form doped regions. A field isolation layer is then formed on the exposed portions of the substrate, while the doped region under the field isolation layer between the channel region and the predetermined region serves as a drift region, and the doped region under the field isolation layer at the periphery of the predetermined region serves as a modifying doped region. Thereafter, a gate dielectric layer and a gate are formed covering the channel region, and a source region and a drain region are formed in the substrate beside the gate using the gate and the field isolation layer as a mask.

In the HV-MOS device of this invention, the modifying doped region at the periphery of the at least one doped region separated from the gate by the field isolation layer can increase the breakdown voltage of the device. It is more preferable that the modifying doped region and the drift region together completely surround the at least one doped region for effectively increasing the breakdown voltage.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3, 4 and 2A/2B illustrate a process flow of fabricating a HV-MOS device according to the preferred embodiment of this invention, wherein FIGS. 3 and 4 are also cross-sectional views along line II-II'.

DETAILED DESCRIPTION

Figure 1:
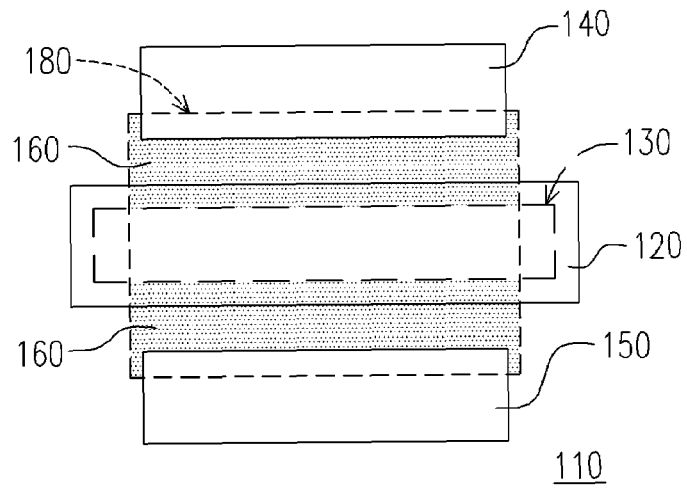
FIG. 1 illustrates the top view of a conventional HV-MOS device.
Figure 2A:
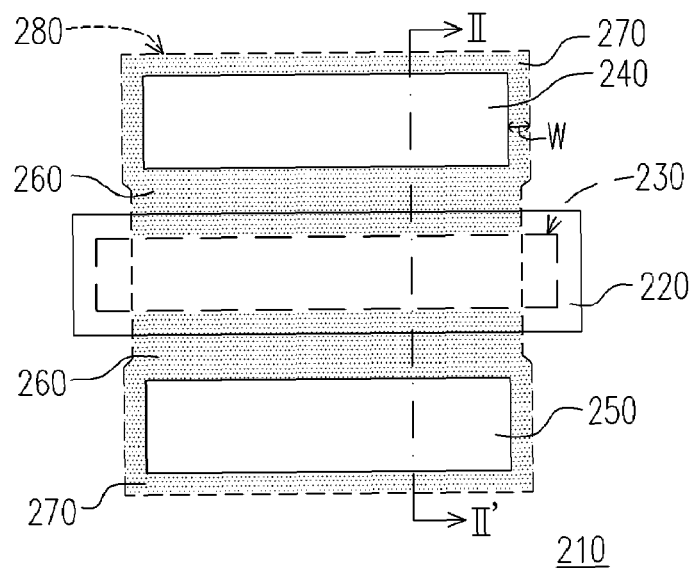
FIGS. 2A and 2B illustrate a HV-MOS device according to a preferred embodiment of this invention in a top view and in a cross-sectional view along line II-II', respectively.
Figure 2B:
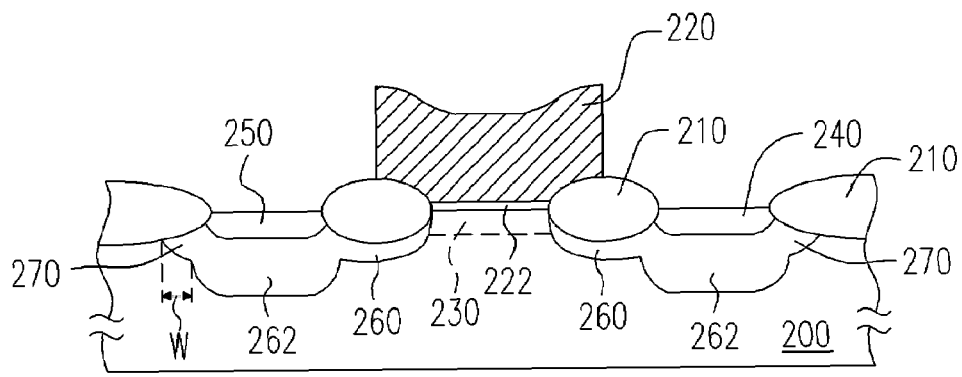

FIGS. 2A and 2B illustrate a HV-MOS device according to the preferred embodiment of this invention in a top view and in a cross-sectional view along line II-II", respectively. Referring to FIGS. 2A and 2B, the HV-MOS device includes a substrate 200, a field isolation layer 210 on a substrate 200, a gate 220, a gate dielectric layer 222, a channel region 230, a source region 240 and a drain region 250, two drift regions 260 and two modifying doped regions 270.

The substrate 200 is, for example, a single-crystal silicon wafer, and the field isolation layer 210 may be a field oxide (FOX) layer formed with a thermal oxidation process. The gate dielectric layer 222 is disposed on the substrate and surrounded by the field isolation layer 210, the gate 220 covers the gate dielectric layer 222, and the channel region 230 is located in the substrate 200 under the gate dielectric layer 222 and surrounded by the field isolation layer 210. The source region 240 and the drain region 250 are located in the substrate 210 beside the channel region 230, each being surrounded by the field isolation layer 210. The drift region 260 is located in the substrate 200 under the field isolation layer 210 between the channel region 230 and each of the source region 240 and the drain region 250. In addition, each of the heavily doped source region 240 and drain region 250, i.e., contact regions, further has an underlying grade extension region 262 that is lightly doped.

Referring to FIGS. 2A and 2B again, each modifying doped region 270 is in the substrate 200 at the periphery of the source/drain region 240/250, so that the source/drain region 240/250 is completely surrounded by a drift region 260 and a modifying doped region 270 together. The modifying doped region 270 is for modifying the corner shape of the grade extension region 262, so as to reduce the electric field there and increase the breakdown voltage of the HV-MOS device. In addition, the modifying doped region 270 may have a uniform width (W), as shown in FIG. 2A. The drift regions 260 and the modifying doped regions 270 can be formed simultaneously by implanting a dopant into the substrate 200 using a mask layer having an opening 280 therein as a part of the implantation mask, which is described below in details. The doping concentration of the drift regions 260 and the modifying doped region 270 ranges from $5 \times 10^{15}/cm^3$ to $5 \times 10^{17}/cm^3$.

Figure 3:
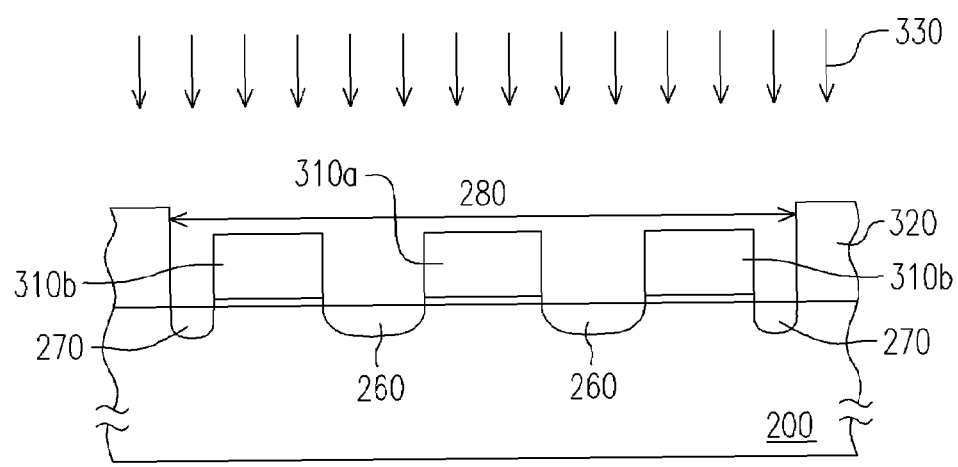
Figure 4:
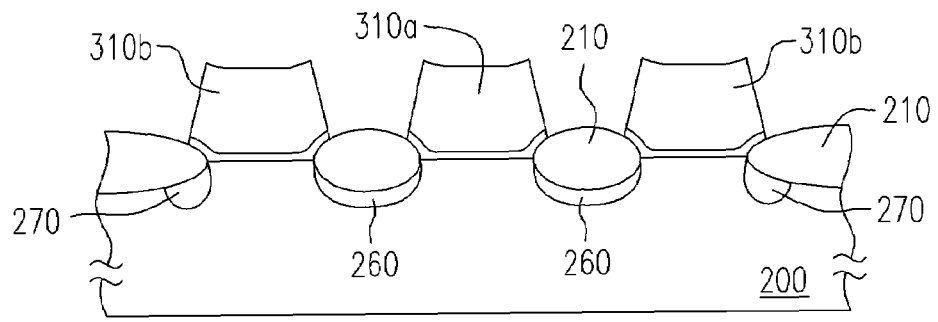

FIGS. 3, 4 and 2A/2B illustrate a process flow of fabricating a HV-MOS device according to the preferred embodiment of this invention, wherein FIGS. 3 and 4 are also cross-sectional views along line II-II". Referring to FIG. 3, a substrate 200 is provided, and then a first mask layer 310a/b defining the active areas and a second mask layer 320 are sequentially formed on the substrate 200. The first mask layer 310a/b includes a first part 310a covering the region of the substrate 200 predetermined for the channel region 230 and two second parts 310b covering the two regions predetermined for the source region 240 and the drain region 250, respectively. The boundaries of the first part 310a and the two second parts 310b of the first mask layer 310a/b are approximately the same as those of the channel region 230, the source region 240 and the drain region 250, respectively. The first mask layer 310a/b may include a pad oxide layer and a thick silicon nitride (SiN) layer thereon.

The second mask layer 320 has an opening 280 therein, which exposes the substrate 200 between the first part 310a and the two second parts 310b of the first mask layer 310a/b and another portion of the substrate 200 at the peripheries of the two second parts 310b. The opening 280 in the second mask layer 320 is preferably formed exposing a portion of the substrate 200 completely surrounding each second part 310b, so that the drift region 260 and the modifying doped region 270 formed latter together completely surround the grade extension region 262 to effectively increase the breakdown voltage. In addition, the second mask layer 320 may be a patterned photoresist layer. Thereafter, ion implantation 330 is performed to formed doped region 260 and 270 in the substrate 200 using the first mask layer 310 and the second mask layer 320 as an implantation mask. The dosage of the ion implantation 330 ranges from $10^{12}/cm^2$ to $10^{14}/cm^2$.

Referring to FIG. 4, the second mask layer 320 is removed, and then a field isolation layer 210 is formed on the substrate 200 using the first mask layer 310a/b as a mask. The field isolation layer 210 is preferably formed with a thermal oxidation process, which produces a field oxide (FOX) layer on the exposed portions of the substrate 200, while the dopant in the doped regions 260 and 270 are driven down. The doped regions 260 under the field isolation layer 210 between the first part 310a and the two second parts 310b of the first mask layer 310a/b serve as drift regions, and the doped regions 270 under the field isolation layer 210 at the peripheries of the two second parts 310b of the first mask layer 310a/b serve as modifying doper regions.

Referring to FIGS. 2A/2B, the first mask layer 310a/b is removed, and then a gate dielectric layer 222 is formed on the channel region 230. A gate 220 is formed over the substrate 200 covering the gate dielectric layer 222 and the channel region 230 as well as a portion of the field isolation layer 210. A source region 240 and a drain region 250 that are heavily doped to serve as contact regions, as well as the lightly doped grade regions 262, are then formed in the substrate 200 using the field isolation layer 210 and the gate 220 as a mask. The grade regions 262 are formed deeper than the source/drain region 240/250.

Figure 5:
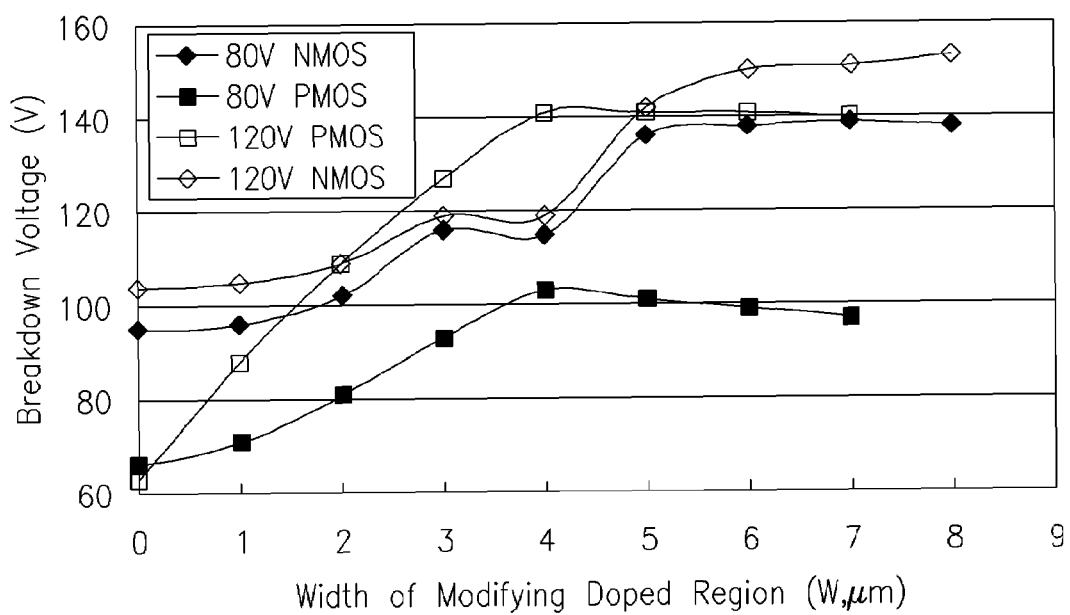
FIG. 5 shows the test result of HV-PMOS and HV-NMOS devices of 80V or 120V according to the preferred embodiment of this invention, wherein x-axis represents the width "W" (□m) of the modifying doped region and y-axis the breakdown voltages of the HV-MOS devices.

FIG. 5 shows the test result of HV-PMOS and HV-NMOS devices of 80V or 120V according to the preferred embodiment of this invention, wherein x-axis represents the width "W" of the modifying doped region (FIGS. 2A/2B) and y-axis the breakdown voltages of the HV-MOS devices. As shown in FIG. 5, the breakdown voltage of the HV-PMOS or HV-NMOS of 80V or 120 V can be effectively increased by using the method of this invention.

Since the additional modifying doped region 270 can reduce the corner curvature of the depletion region of the S/D grade region 262, as shown in FIG. 2B, the electric field there can be reduced to increase the breakdown voltage of the HV-MOS devices according to this invention.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

The invention claimed is:

1. A high-voltage metal-oxide-semiconductor (HV-MOS) device, comprising:
    a substrate;
    a gate dielectric layer on the substrate;
    a gate on the gate dielectric layer;
    a channel region in the substrate under the gate dielectric layer;
    two doped regions as a source and a drain in the substrate beside the gate;
    a field isolation layer between the gate and the two doped regions;
    a drift region in the substrate under the field isolation layer located in one side of the at least one doped region, connecting with the channel region and the at least one doped region; and
    a modifying doped region in the substrate with a uniform width, wherein the drift region and the modifying doped region together completely surround the doped regions and are doped with the same type dopant.

2. The HV-MOS device of claim 1, wherein the modifying doped region is in the substrate located in the other sides of the two doped regions opposite to the drift region.

3. The HV-MOS device of claim 1, wherein the field isolation layer comprises a field oxide (FOX) layer.

4. The HV-MOS device of claim 1, wherein a doping concentration of the drift region and the modifying doped region ranges from $5 \times 10^{15}/cm^3$ to $5 \times 10^{17}/cm^3$.

5. A high-voltage metal-oxide-semiconductor (HV-MOS) device, comprising:
    a substrate;
    a gate dielectric layer on the substrate;
    a gate on the gate dielectric layer;

a channel region in the substrate under the gate dielectric layer;

two heavily doped regions as a source and a drain in the substrate beside the gate;

two lightly doped grade region under and surrounding the two heavily doped regions respectively;

a field isolation layer between the gate and the two heavily doped regions;

a drift region in the substrate under the field isolation layer located in one side of the at least one lightly doped grade region; and a modifying doped region in the substrate located in the other side of the at least one lightly doped grade region, wherein the modifying doped region has a uniform width and the drift region and the modifying doped region together encircle the heavily doped regions.

6. The HV-MOS device of claim 5, wherein the modifying doped region is in the substrate located in the other sides of the two lightly doped grade regions opposite to the drift region.

7. The HV-MOS device of claim 5, wherein the field isolation layer comprises a field oxide (FOX) layer.

8. The HV-MOS device of claim 5, wherein a doping concentration of the drift region and the modifying doped region ranges from $5 \times 10^{15}/cm^3$ to $5 \times 10^{17}/cm^3$.

9. The HV-MOS device of claim 5, wherein the drift region and the modifying doped region are doped with the same type dopant.

* * * * *